United States Patent [19]
Sieck

[11] Patent Number: 5,645,699
[45] Date of Patent: Jul. 8, 1997

[54] DUAL CYLINDRICAL TARGET MAGNETRON WITH MULTIPLE ANODES

[75] Inventor: Peter A. Sieck, Santa Rosa, Calif.

[73] Assignee: The BOC Group, Inc., New Providence, N.J.

[21] Appl. No.: 667,773

[22] Filed: Jun. 21, 1996

Related U.S. Application Data

[63] Continuation of Ser. No. 301,114, Sep. 6, 1994, abandoned.

[51] Int. Cl.$^6$ ............................................. C23C 14/35
[52] U.S. Cl. ........................... 204/192.12; 204/298.14; 204/298.22; 204/298.26
[58] Field of Search ................ 204/192.12, 298.14, 204/298.22, 298.26

[56] References Cited

U.S. PATENT DOCUMENTS

| | | | |
|---|---|---|---|
| 4,465,575 | 8/1984 | Love et al. | 204/192.26 |
| 4,466,877 | 8/1984 | McKelvey | 204/298.23 |
| 4,478,702 | 10/1984 | Gillery et al. | 204/298.19 |
| 4,744,880 | 5/1988 | Gillery et al. | 204/298.19 |
| 4,849,087 | 7/1989 | Meyer | 204/298.03 |
| 5,106,474 | 4/1992 | Dickey et al. | 204/298.14 |
| 5,108,574 | 4/1992 | Kirs et al. | 204/298.22 |
| 5,158,660 | 10/1992 | Devigne et al. | 204/298.21 |
| 5,178,743 | 1/1993 | Kumar | 204/298.21 |

FOREIGN PATENT DOCUMENTS

| | | | |
|---|---|---|---|
| WO92/01081 | 1/1992 | WIPO | 204/298.26 |
| WO92/09718 | 6/1992 | WIPO | 204/298.14 |

OTHER PUBLICATIONS

Patent Abstracts of Japan vol. 018 No. 201 (C–188), 8 Apr. 1994 & JP-A-06-002123 (Mitsubishi Heavy Ind Ltd) 11 Jan. 1994, "abstract".

"Cosputtering and Serial Cosputtering Using Cylindrical Rotatable Magnetrons", A. Belkind, J. Vac. Sci. Technol. A vol. 11(4), Jul./Aug. 1993, pp 1501–1509.

Article of: Sieck, P., "Effect of Anode Location on Deposition Profiles for Long Rotatable Magnetrons," 37th Annual Technical conference of the Society of Vacuum Coaters, Boston, May 8–13, 1994, pp. 233–236.

*Primary Examiner*—Aaron Weisstuch
*Attorney, Agent, or Firm*—David A. Draegert; Salvatore P. Pace

[57] ABSTRACT

Two adjacent rotating cylindrical targets are used in a specific form of a vacuum sputtering system to deposit a film of material onto a substrate. Elongated anodes are provided on opposite sides and in between the targets in a manner to make more uniform the rate of deposition across the substrate.

9 Claims, 3 Drawing Sheets

DUAL CYLINDRICAL TARGET MAGNETRON WITH MULTIPLE ANODES

This is a continuation of application Ser. No. 08/301,114, filed Sep. 6, 1994, now abandoned.

BACKGROUND OF THE INVENTION

This invention relates generally to the art of depositing films onto substrates by vacuum sputtering, and, more specifically, to the deposition of electrically conducting films by a cylindrical magnetron type sputtering apparatus using two targets.

There are many applications where films are deposited onto substrates by sputtering techniques. Once such application is in the coating of large substrates, such as glass for building windows, vehicle windshields, and the like. Several thin film layers are stacked one on top of each other in order to control the reflection and/or transmission of various light wavelength bands. Each of these layers is formed by sputtering, according to a common commercial technique, in a vacuum chamber. In such applications, it is desirable to form the film with a carefully controlled thickness over the surface of the substrate. In most cases, it is desirable that the thickness be uniform over the entire substrate but, in other cases, some controlled variation in thickness across the substrate surface is desired.

Such a cylindrical magnetron type sputtering apparatus includes a target composed of an element to be sputtered, held adjacent the magnetic structure that defines an erosion zone on the surface of the target. That is, the magnetic structure confines and directs the ions of a plasma, formed adjacent to the target surface, at a high velocity against the target in its erosion zone in order to dislodge atoms of the element desired to be sputtered away. An electrical power supply is connected to the target as a cathode and to another surface within the vacuum chamber as an anode. Some proportion of free electrons within the target plasma generally travel around the defined erosion zone, sometimes called a "race track". However, some percentage of these electrons escape from the magnetic containment as they travel around the race track, and are then collected by the anode. It is known that the size and position of the anode can affect the profile of the deposition rate across a substrate, among other factors.

The target can be a static form, often with a planar surface. It is generally preferred, however, to form the target on an outside surface of a cylinder that is rotated about its elongated axis. The target surface is thus constantly being moved through the stationary magnetic field. The target surface is then more uniformly eroded and thus better utilized. Two sets of rotating magnetron assemblies are often positioned side by side within a single vacuum chamber.

It is a primary object of the present invention to provide a dual target magnetron, and technique for using such a system, which has a uniform rate of deposition across a substrate when moving past the targets.

It is another object of the present invention to provide an improved anode structure for a dual target magnetron.

SUMMARY OF THE INVENTION

It has been found that an elongated anode extending along a side of a target structure is principally effective in a relatively small area of the anode. That area is adjacent one end of the target race track along a side into which the travelling electrons drifting around the race track are directed upon making a turn at an end of the race track. For an elongated target and narrow, long race track, it has been found that about 90 percent of the total anode current is gathered by these relatively small portions of the anode surface. This results in a very uneven rate of deposition onto a substrate, the deposition being very heavy at the end of the target with the active anode area, and trailing off very rapidly to only a small fraction of that rate at a position at an opposite end of the target.

When two such target structures are used together, each with its own elongated anode positioned adjacent an outside edge of the target farthest removed from the other target, each end of the target produces a heavy deposition but a lower deposition rate exists in the middle. It has been discovered that the positioning of an elongated anode in between the two targets makes the rate of distribution substantially uniform in a direction along the length of the targets. It would seem that such a middle anode would simply increase further the rate of deposition at the ends of the targets without making that distribution more uniform. As with the outside anodes, only a small area adjacent the ends of the middle anode are active in gathering most of the current drawn by the anode. However, an unexpected result of such a middle anode is that it makes the rate of deposition substantially uniform across the substrate. This is a very desirable result for many applications, particularly for depositing films on large, flat substrates, windows for commercial buildings being an example.

The foregoing has only briefly summarized the principal aspect of the present invention. Additional features, objects and advantages of the various aspects of the present invention are included in the following description of its preferred embodiments, which description should be taken in conjunction with the accompanying drawings.

DESCRIPTION OF THE PREFERRED EMBODIMENTS

Figure 1:
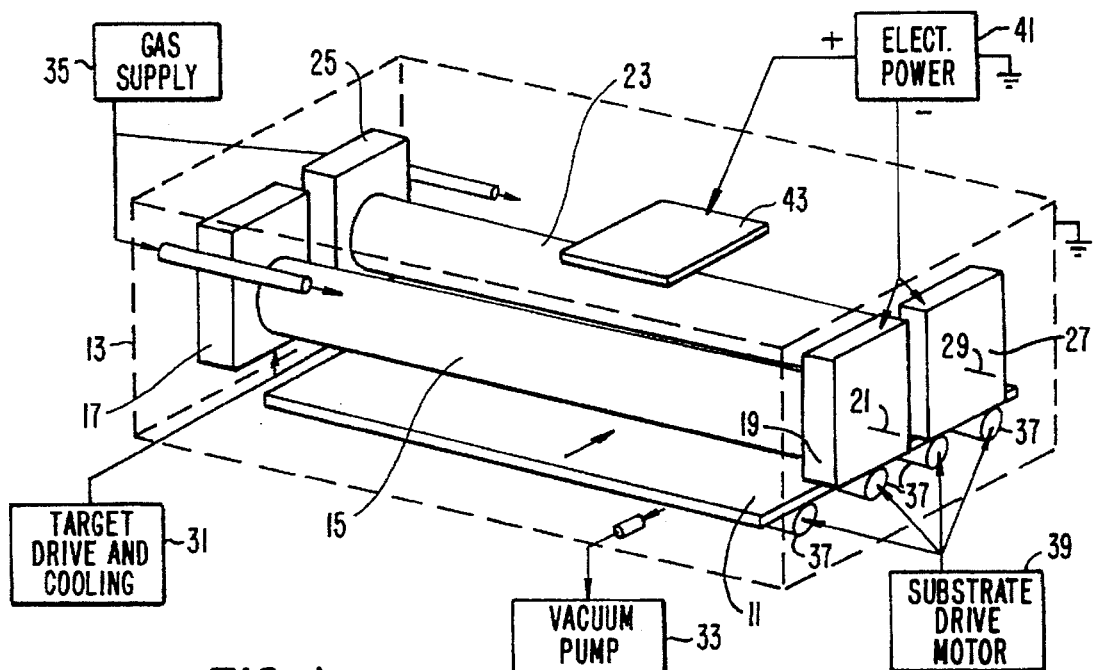
FIG. 1 shows the main components of a dual-target magnetron, in a schematic representation.

As background, FIG. 1 illustrates the essential components forming a dual target magnetron. A substrate 11 is moved in the direction of the arrow through a vacuum chamber that is shown with walls 13 in dashed outline. A first cylindrical target 15 is held by end blocks 17 and 19 in a manner to be rotated about an axis 21 of the target's cylindrical surface. Similarly, a second target 23 is carried by end blocks 25 and 27 in a manner to be rotatable about an axis 29 of that target's cylindrical surface. The targets 15 and 23 are rotated with respect to their end blocks at a constant speed. A mechanism for so driving the targets and providing cooling fluid internal of the targets, both through their end blocks 17 and 25, is indicated generally by a block 31. A vacuum is maintained within the chamber by a vacuum system indicated at 33.

Gas necessary for depositing a film on the top surface of the substrate 11 is supplied to the chamber through a gas supply system indicated at 35. This gas is either inert or one that reacts with the element sputtered off of the target surfaces, or both. A number of substrate supporting rollers 37 are rotated by a drive motor 39 in order to move the substrate 11 through the chamber in a direction orthogonal to the axes of rotation 21 and 29 of the targets. An electrical power supply 41 has its negative terminals connected through the blocks 19 and 27 to the respective target surfaces 15 and 23, thereby to form the cathode of the magnetron. The positive terminal of the power supply 41 is connected to an anode 43 that is generally shown in FIG. 1. It is the position in shape of such an anode that is the subject matter of the present invention, as described below. The outer walls 13 which form the vacuum chamber are made of a metal and held at ground potential. The deposition of films can be accomplished with the power supply 41 providing an alternating current output, either a low frequency or up to a radio frequency range, but higher deposition rates are obtained when a direct current supply is utilized.

Each of the targets 15 and 23 contains an elongated permanent magnet structure extending along the length of the target. Such a structure is illustrated generally in FIG. 2A, where a sectional view of a target similar to the target 15 reveals such a structure 45 carried by a liquid coolant tube 47. The magnetic structure 45 extends substantially the entire length of the target 15. Three magnetic poles are utilized, a north pole positioned in between two south poles. The magnetic structure 45 is held fixed and does not rotate with the cylindrical target 15. The magnetic fields form narrow zones 49 and 51 extending along the length of the target surface in between the north and south magnetic poles. These are zones which confine ions within the plasma formed in the chamber. The ions within these zones are caused to strike the target surface at a high velocity, thereby to dislodge atoms of the element or elements of which the target surface is formed.

Figure 2A:
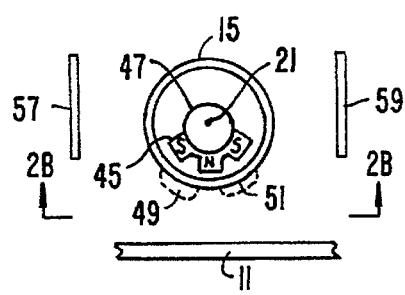
FIG. 2A is a cross-sectional view of a magnetron of the type illustrated in FIG. 1 but with a single target and different anode configuration.
Figure 2B:
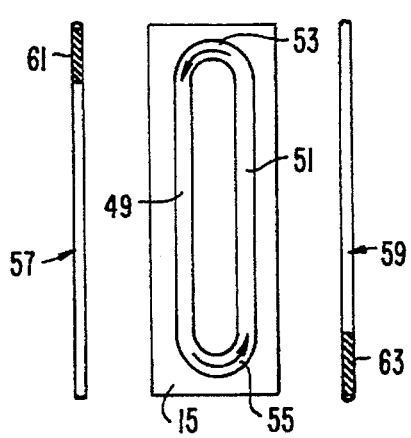
FIG. 2B is a bottom view of the single target magnetron of FIG. 2A, as viewed in the direction of the arrows 2B—2B.

As can be seen from the bottom view of the target 15 in FIG. 2B, an erosion zone is created on the surface of the target 15 by the magnetic zones 49 and 51, this erosion zone being a continuous path which joins the elongated parallel portions 49 and 51 by portions 53 and 55 adjacent ends of the magnetic structure 45. The erosion zone portions 49, 51, 53, and 55 together form a continuous "race track" around which electrons travel in a single direction indicated by the arrows. This direction depends upon the relative position of the magnetic poles of the magnetic structure. The direction would be opposite if the magnetic structure 45 had a south pole in the middle and a north pole on either side of it.

Figure 2C:
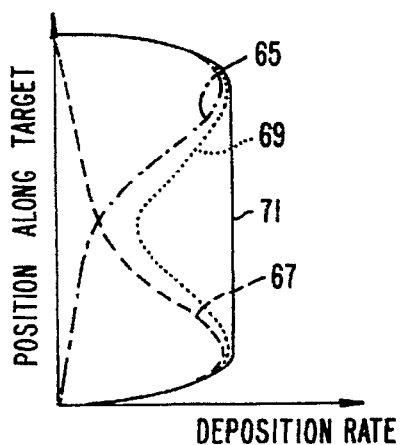
FIG. 2C shows several curves of deposition rate profiles with different combinations of anodes in the single target magnetron of FIGS. 2A and 2B.

Before describing the improved anode structure in a dual target magnetron, it is instructive to first describe some discoveries that have been made with respect to anodes used with a single target. Figures 2A, 2B and 2C illustrate the use of a single target structure within a vacuum chamber of the system of FIG. 1, for discussion purposes. On either side of the target are positioned anodes 57 and 59. These anodes are electrically connected together and to the positive terminal of the power supply 41 (FIG. 1), in place of the anode 43 there shown. Each of the anodes 57 and 59 extend substantially the full length of the racetrack formed on the surface of the target 15. They may be made of a continuous piece of metallic material that is either strong enough to support itself or is supported with the aid of other rigid elements. The surface of each of these anodes need not be continuous, but rather can be formed of two or more sections of metallic sheets that are separated along the anode lengths by a small gap in order to allow for thermal expansion. Any such segments of an anode are electrically connected together by wire braid or the like. Each of the anodes is shown to be positioned with their lengths extending in a direction parallel with the axis 21 of rotation of the target 15 and substantially perpendicular to the substrate 11 on which a film is being deposited but these geometric constraints are not essential to the operation being described.

It has been found that only a small portion of the elongated anodes 57 and 59 receive a large majority of the electron current carried by the anodes. Referring to FIG. 2B the shaded area 61 extending a short length of the anode 57 has been found to receive about 90 percent of the electrons from the adjacent plasma that the entire anode 57 receives. Similarly, the small shaded area 63 of the anode 59 receives about 90 percent of the electrons received by the entire anode 59. This has been found to be the case whether one or both of the anodes 57 or 59 are utilized. The active anode areas appear to be in a path of the drift electrons travelling around the racetrack of the target but exit that race track at the sharp turns at the racetrack ends 53 and 55. This drastic uneven current distribution was ascertained by experiments that broke the elongated anodes into separate sections and measured the current received by each such section.

The results of using either one of the anodes 57 or 59 alone, as well as both of them together, are shown in FIG. 2C. If only the anode 57 is positioned and connected to the power supply, the rate of deposition across the substrate in a direction of the length of the target 15 follows the profile of curve 65. Similarly, if only the anode 59 is used, a deposition rate profile of curve 67 is obtained. Once it was discovered that only the small area 61 and 63 of the anodes 57 and 59 carry most of the electron current, these very non-uniform deposition rate profile curves 65 and 67 can be explained on the basis that an anode plasma exists which is positioned adjacent active anode areas, and that the rate of deposition of material onto a substrate is the highest where such plasma exists.

It is thus expected that when both anodes 57 and 59 are utilized, that a profile of the deposition rate across the substrate would follow that of curve 69. The deposition rate would be expected to be higher at the ends of the target 15, where the active anode areas 61 and 63 exist, and lower in the middle. The profile 69 should be, it is expected, roughly a sum of the two curve 65 and 67 obtained by use of only one of the anodes 57 and 59 at a time. However, it has been found that a uniform distribution rate is obtained across the substrate along the length of the target 15, as shown by curve 71 of FIG. 2C. Operation of the single target magnetron system of FIG. 2A and 2B is thus different from what one might expect from the above observations of its operation with each of the two anodes separately.

Figure 3A:
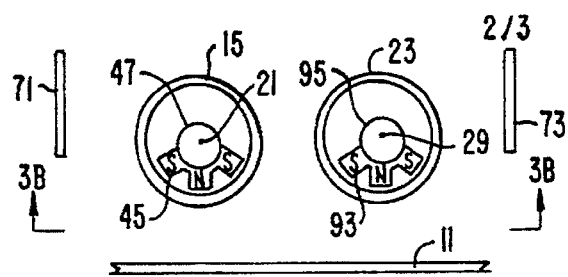
FIG. 3A is a cross-sectional view of a dual target magnetron of the type illustrated in FIG. 1 with a first arrangement of anodes.
Figure 3B:
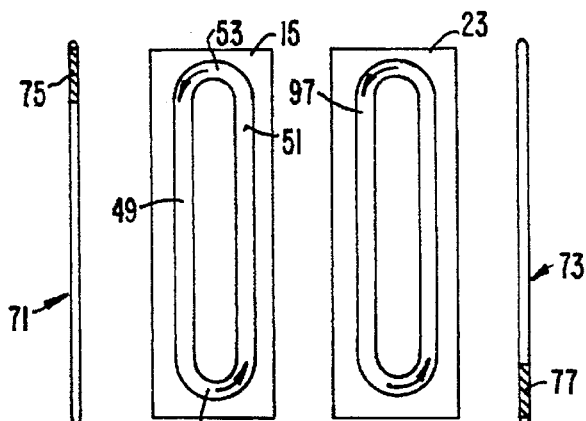
FIG. 3B is a bottom view of the dual target magnetron of FIG. 3A, as viewed in the direction of the arrows 3B—3B thereof.
Figure 3C:
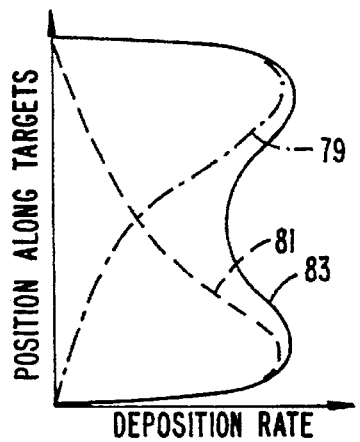
FIG. 3C shows several deposition rate curves for different anode configurations in the system of FIGS. 3A and 3B.

FIGS. 3A, 3B and 3C show the structure and operation of the magnetron system of FIG. 1 with both of the target assemblies being utilized. Elongated anodes 71 and 73 are respectively positioned along outside surfaces of each of the targets 15 and 23 furthest removed from the other. Active areas 75 and 77 were found to exist in the anode along the anode surfaces 71 and 73, respectively, as previously described with respect to FIG. 2B. When only the anode 71 is utilized, the profile of the rate of deposition across the substrate is shown by curve 79 of FIG. 3C, deposition is skewed to the end of the targets where the active anode region 75 exists. Similarly, if only the anode 73 is utilized, a deposition rate profile shown by curve 81 is obtain. When both anodes are utilized, a deposition rate profile 83 is obtained, roughly being the sum of the curve 79 and 81. Each of the targets 15 and 23, with its respective anode 71 and 73, appears to be operating independently of the other. Such independent operation is what one would expect.

Figure 4A:
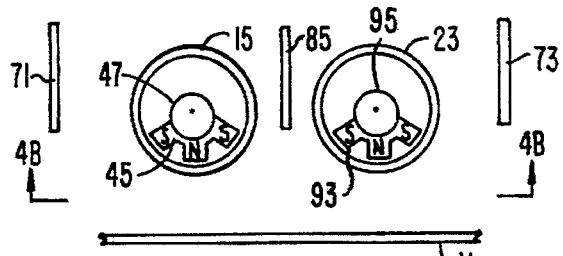
FIG. 4A is a cross-sectional view of a dual target magnetron of the type illustrated in FIG. 1 but with a second arrangement of anodes.
Figure 4B:
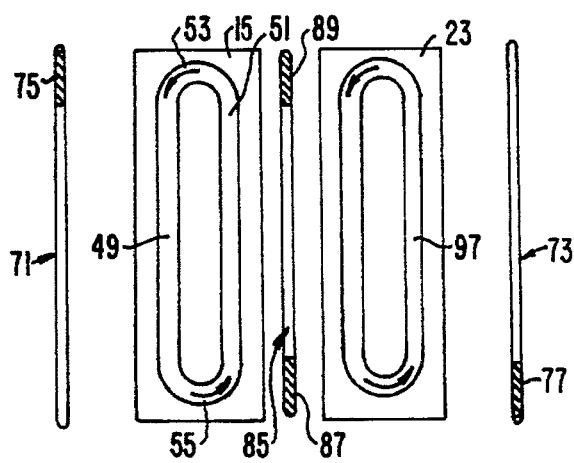
FIG. 4B is a bottom view of the dual target magnetron of FIG. 4A, as viewed in the direction of the arrows 4B—4B thereof.
Figure 4C:
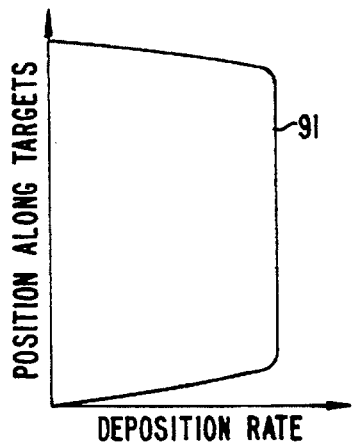
FIG. 4C shows a deposition rate profile curve of the system of FIGS. 4A and 4B.

Referring to FIGS. 4A, 4B and 4C, the effect of adding a third anode 85 in between the targets in the configuration of FIGS. 3A and 3B, is explored. This middle target has active current regions at both ends, the region 87 receiving about 90 percent of the current that the anode 85 receives from the drift current in the race track of the target 15. Similarly, the small region 89 receives about 90 percent of the current that the anode 85 receives from the drift current in a similar race track adjacent the surface of the target 23. All of the anodes 71, 73, and 85 are preferably electrically connected together to the positive terminals of two power supplies. One of the power supplies has its negative terminal connected to the target 15, and the other has its negative terminal connected to the target 23.

One would expect that the addition of active anode areas 87 and 89 adjacent ends of the targets 15 and 23 would simply accentuate the uneven rate of deposition illustrated by the curve 83 of FIG. 3C. However, consistent with the discovery described with respect to FIGS. 2A, 2B and 2C, the distribution rate becomes uniform instead, as shown by curve 91 of FIG. 4C.

The second target 23 also includes a magnetic structure 93 (FIGS. 3A and 4A) that is carried by a cooling conduit 95 to extend substantially the entire length of the target. A race track 97 along the surface of the target is formed by the magnetic structure, similar to that described for the target 15. It can thus be seen that the active anode areas 77 and 89 that receive electron current from the plasma associated with the target 23 are located at opposite ends of the racetrack 97, on opposite sides thereof in the path of electrons that drift away at the sharp turn at the race track end.

The arrangement of the north and south poles of the magnetic assemblies 45 and 93 control the direction of this drift current, that direction being shown by the arrows of FIGS. 3B and 4B. If one of those magnetic assemblies has its relative polarities rearranged to provide a south pole in the middle and north poles on the outside, the drift current around its racetrack would proceed in a direction opposite to that shown. The result in the embodiment of FIGS. 4A and 4B is that both of the areas 87 and 89 would be formed at the same end of the middle anode 85, instead of at opposite ends. This is undesirable for a number of reasons, a primary one being that it is likely to exceed a limited current capability of the anode structure.

Figure 5A:
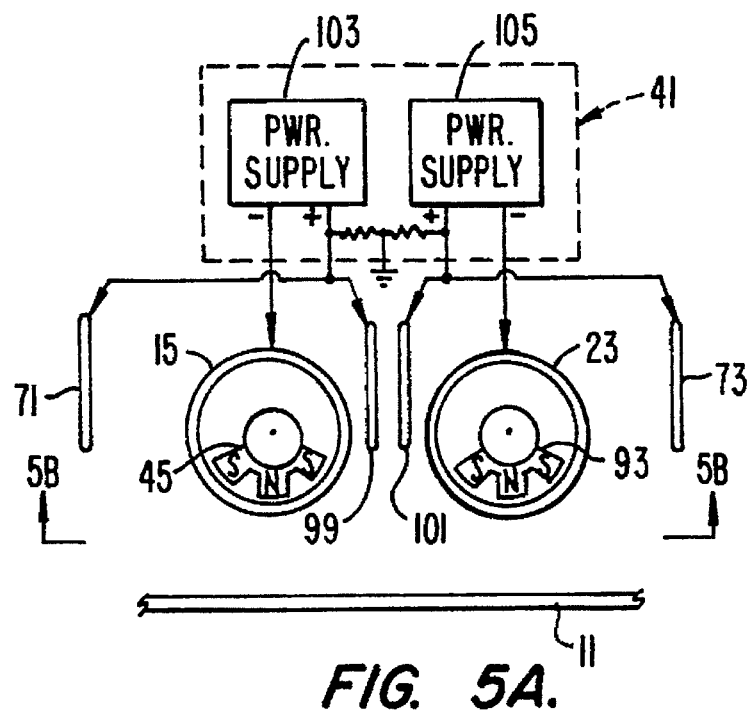
FIG. 5A is a cross-sectional view of a dual target magnetron of the type illustrated in FIG. 1 but with a third arrangement of anodes.
Figure 5B:
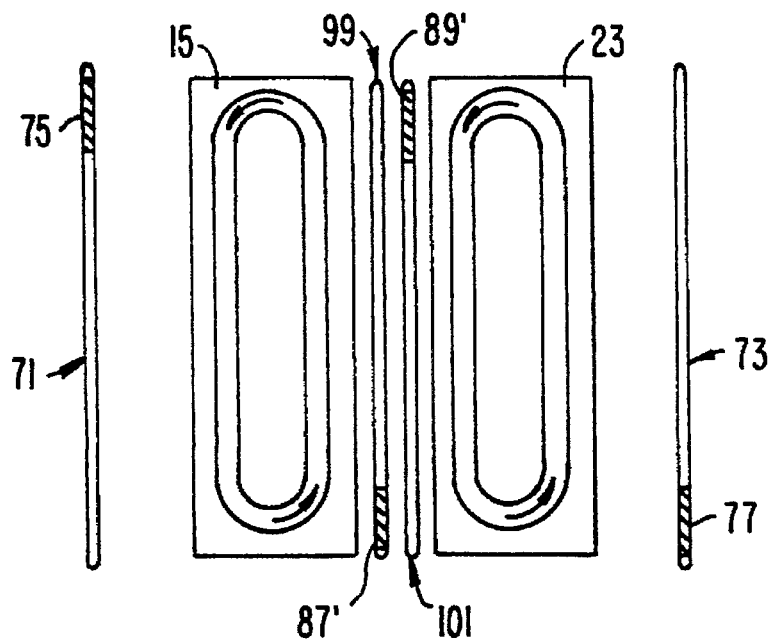
FIG. 5B is a bottom view of the dual target magnetron of FIG. 5A as viewed in the direction of the arrows 5B—5B thereof.

A preferred anode arrangement for a dual target magnetron is illustrated in FIGS. 5A and 5B. Instead of a single elongated anode in between the targets 15 and 23, two adjacent elongated anodes 99 and 101 are utilized. These anodes provide, respectively, high current regions 87' and 89' corresponding to regions 87 and 89 of FIG. 4B. The power supply 41 includes two separate D.C. power supplies 103 and 105. The supply 103 has its positive terminal connected with both of the anodes 71 and 99, and its negative supply connected with the target's surface 15. Similarly, the supply 105 has its positive terminal connected to both of the anodes 73 and 101, with its negative terminal connected to the target surface 23. This arrangement provides the same deposition rate profile 91 as the system of FIGS. 4A and 4B. With separate middle anodes 99 and 101, the relative magnetic polarity of the magnet structures 45 and 93 can be made different since the separate anodes will carry the current from their respective targets.

The foregoing description has been with respect to a dual rotating cylindrical target structure but the same principles apply if two elongated stationary target surfaces are used, either in a planar configuration or otherwise.

The dual target magnetron arrangements described herein can be used for depositing a wide variety of types of films on various sizes and shapes of substrates. The deposition of dielectric films by reactive sputtering is difficult, however, because the anode surfaces become coated with the dielectric after a short period of operation and thus become ineffective, at least when a direct current power supply is used. Therefore, these configurations work best for depositing electrically conductive films. Popular examples are titanium nitride (TIN) and tin oxide ($SnO_2$). For long term deposition, it is best that the films being deposited have a resistivity that is less than ten thousand ohm-centimeters.

Although the various aspects of the present invention have been described with respect to their preferred embodiments, it will be understood that the invention is entitled to protection within the full scope of the appended claims.

It is claimed:

1. In a magnetron having at least first and second targets from which material is sputtered in order to deposit a film on a substrate, each of said first and second targets being symmetrically shaped about an axis, said targets being held with their said axes oriented parallel to each other and with a space between the targets in a direction orthogonal to said axes, an improved anode arrangement, comprising:

first and second elongated anodes with lengths thereof positioned parallel to said axes, said first and second anodes being spaced apart from said targets along sides thereof remote from said space, and at least a third elongated anode positioned parallel to said axes and in the space between said first and second targets.

2. The magnetron of claim 1 wherein said first, second, and third elongated anodes have lengths extending substantially the lengths of the first and second targets.

3. The magnetron of claim 1, additionally comprising a fourth elongated anode positioned in the space between said first and second targets, wherein said third anode faces said first target and said fourth anode faces said second target, and comprising first and second power supplies, said first power supply being connected between said first target and said first and third anodes, and said second power supply being connected between said second target and said second and fourth anodes.

4. Apparatus for depositing a film of material onto a substrate within a vacuum chamber which includes first and second adjacent elongated target surfaces and anode surfaces, an electrical power supply outside of said vacuum chamber being connected with said target and anode surfaces, said apparatus further comprising:

first and second magnet structures respectively associated with each of said first and second target surfaces, each of said magnet structures defining an elongated closed loop sputtering zone on its associated target surface that is symmetrical about a central axis that extends along a length of the target surface, whereby electrons drift in a defined direction around the sputtering zone adjacent the target surface, the central axes of said first and second magnetic structures being maintained parallel with each other, and said anode surfaces including first and second surface areas adjacent opposite sides of said first target surface at diagonally opposed corners thereof in positions to capture drift electrons that escape the sputtering zone when turning a corner at a respective end thereof, and third and fourth surface areas adjacent opposite sides of said second target surfaces at diagonally opposed corners thereof in positions to capture drift electrons that escape the sputtering zone when turning a corner at respective ends thereof.

5. Apparatus according to claim 4 wherein each of said first, second, third and fourth anode surface areas are provided as part of respective elongated first, second, third, and fourth anode structures which are oriented parallel to said sputtering zone central axes and extend substantially an entire length of said sputtering zones.

6. Apparatus according to claim 4 wherein said drift current defined direction is the same around each of said first and second target surfaces.

7. Apparatus for depositing a film of material onto a substrate within a vacuum chamber, comprising:

at least first and second cylindrically shaped target surfaces positioned adjacent each other and rotatable about respective cylindrical axes thereof which are maintained parallel to each other, an elongated magnetic structure non-rotatably held within each of the first and second targets, thereby to define a sputtering zone in a region of the target surface through which the magnetic field of its associated magnetic structure passes, means for moving the substrate in a direction that is orthogonal to the target surface axes, first and second elongated anodes with lengths oriented in a direction parallel to the target axes and positioned respectively along oppositely positioned sides of the first and second target surfaces, third and fourth elongated anodes with lengths oriented in a direction parallel to the target axes and positioned in between the first and second targets, the third anode facing the first target and the fourth anode facing the second target, a first power supply with a negative polarity terminal connected to the first target and a positive polarity terminal connected to the first and third anodes, and a second power supply with a negative polarity terminal connected to the second target and a positive polarity terminal connected to the second and fourth anodes.

8. A method of depositing electrically conductive films on substrates within a vacuum chamber including at least first and second targets including electrically conductive material and provided with magnetic structures to form respective first and second elongated closed loop sputtering zones across surfaces of the targets, thereby to form zones of electron drift around the sputtering zones, comprising utilizing four anode surface areas adjacent the first and second targets with one of said four anode surface areas positioned at each end of said first and second elongated sputtering zones with an orientation that captures electrons that leave the sputtering zones at the ends thereof.

9. The method according to claim 8 wherein each of said four anode surface areas is provided as part of an elongated anode extending substantially the length of the sputtering zones.

* * * * *